United States Patent
Doi et al.

(10) Patent No.: US 11,726,794 B2
(45) Date of Patent: Aug. 15, 2023

(54) PREVENTING SUPPLY OF POWER TO A MICROCOMPUTER OF AN ELECTRONIC CONTROL DEVICE UNTIL CAPACITORS ARE DISCHARGED

(71) Applicant: Hitachi Astemo, Ltd., Hitachinaka (JP)

(72) Inventors: Masahiro Doi, Hitachinaka (JP); Yuri Moizumi, Hitachinaka (JP); Takeo Yamashita, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 17/641,252

(22) PCT Filed: Aug. 14, 2020

(86) PCT No.: PCT/JP2020/030856
§ 371 (c)(1),
(2) Date: Mar. 8, 2022

(87) PCT Pub. No.: WO2021/059795
PCT Pub. Date: Apr. 1, 2021

(65) Prior Publication Data
US 2022/0334846 A1    Oct. 20, 2022

(30) Foreign Application Priority Data

Sep. 26, 2019    (JP) .................. 2019-176250

(51) Int. Cl.
G06F 9/44        (2018.01)
G06F 9/4401      (2018.01)
(Continued)

(52) U.S. Cl.
CPC .............. *G06F 9/4401* (2013.01); *G06F 1/26* (2013.01); *H02J 7/0063* (2013.01)

(58) Field of Classification Search
None
See application file for complete search history.

(56) References Cited

U.S. PATENT DOCUMENTS

| | | | | |
|---|---|---|---|---|
| 8,880,911 B2* | 11/2014 | Karino | ................... | H02J 1/001 713/340 |
| 2005/0180079 A1* | 8/2005 | Joseph Gaudreau | ... | H02J 1/102 361/104 |

(Continued)

FOREIGN PATENT DOCUMENTS

JP    63-24408 A    2/1988
JP    2-189613 A    7/1990
(Continued)

OTHER PUBLICATIONS

International Search Report (PCT/ISA/210) issued in PCT Application No. PCT/JP2020/030856 dated Dec. 15, 2020 with English translation (five (5) pages).

*Primary Examiner* — Danny Chan
(74) *Attorney, Agent, or Firm* — Crowell & Moring LLP

(57) ABSTRACT

To obtain a highly reliable electronic control device capable of reliably causing a microcomputer to perform normal termination and normal re-activation by controlling a power supply voltage. According to the present invention, an electronic control device 25 includes a microcomputer 18, a power supply control unit 20 that controls a power supply voltage of the microcomputer, and a capacitor 19 provided between the power supply control unit and the microcomputer. The power supply control unit 20 includes a power supply unit 24 that supplies a first power supply voltage V1 to the microcomputer by turning ON an activation signal for activating the microcomputer, and stops the supply of the power supply voltage by turning the activation signal OFF, a reset control unit 14 that generates a Low reset signal by turning the activation signal OFF, and a discharge control unit 12 that discharges electric charges of the capacitor when acquiring the Low reset signal.

5 Claims, 6 Drawing Sheets

(51) Int. Cl.
*G06F 1/26* (2006.01)
*H02J 7/00* (2006.01)

(56) References Cited

U.S. PATENT DOCUMENTS

| | | | | |
|---|---|---|---|---|
| 2007/0033431 A1* | 2/2007 | Pecone | ............... | G06F 1/28 |
| | | | | 714/6.12 |
| 2011/0179292 A1* | 7/2011 | Clegg | ............... | G06F 1/26 |
| | | | | 713/300 |
| 2011/0215654 A1* | 9/2011 | Kumar | ............... | H02M 3/06 |
| | | | | 307/109 |
| 2012/0319488 A1* | 12/2012 | Yu | ............... | H02M 7/06 |
| | | | | 307/64 |
| 2017/0093319 A1 | 3/2017 | Oba et al. | | |
| 2019/0393773 A1* | 12/2019 | Terada | ............... | H03K 17/284 |

FOREIGN PATENT DOCUMENTS

JP  2014-127113 A  7/2014
JP  2017-70045 A  4/2017

\* cited by examiner

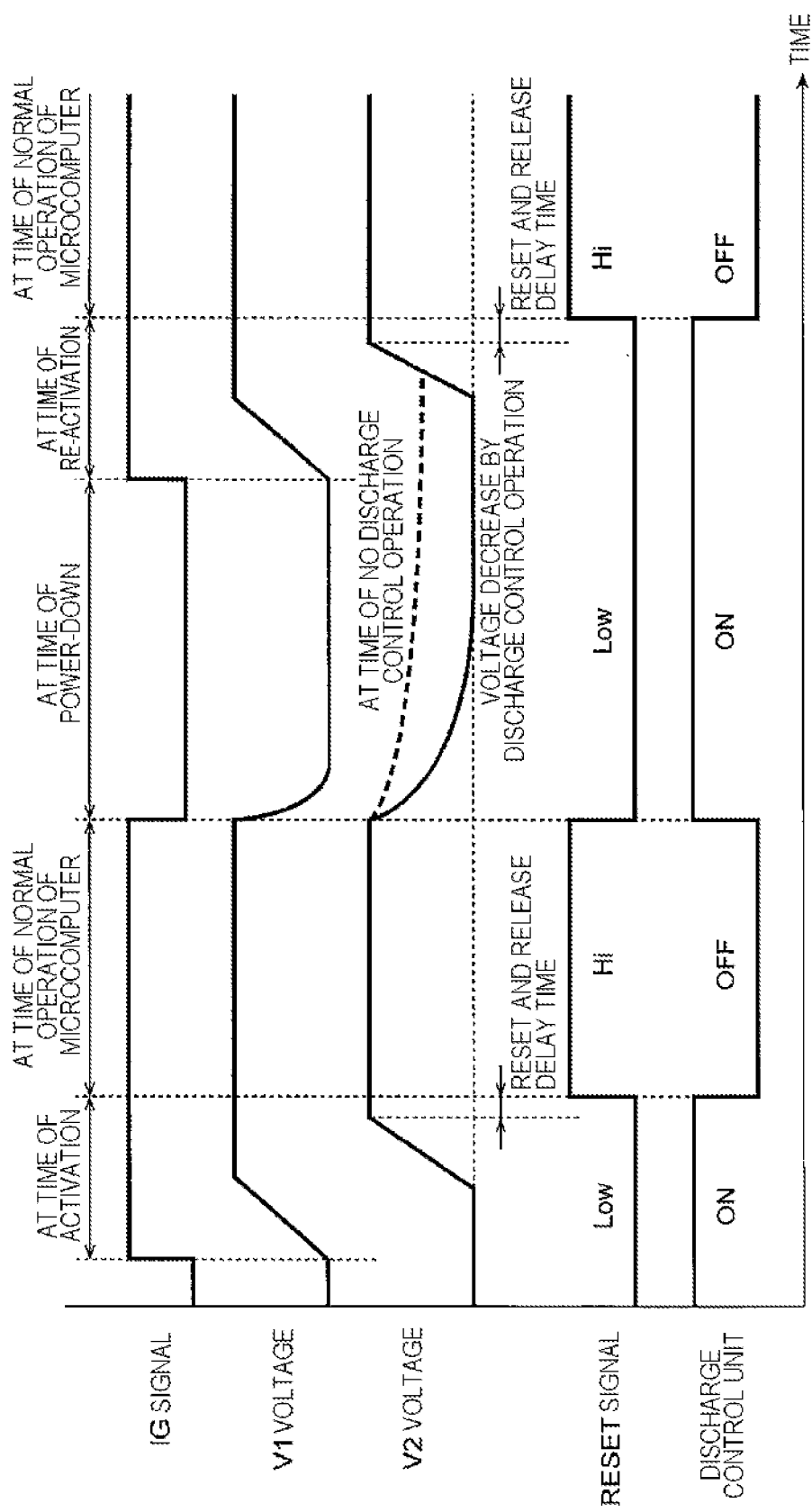

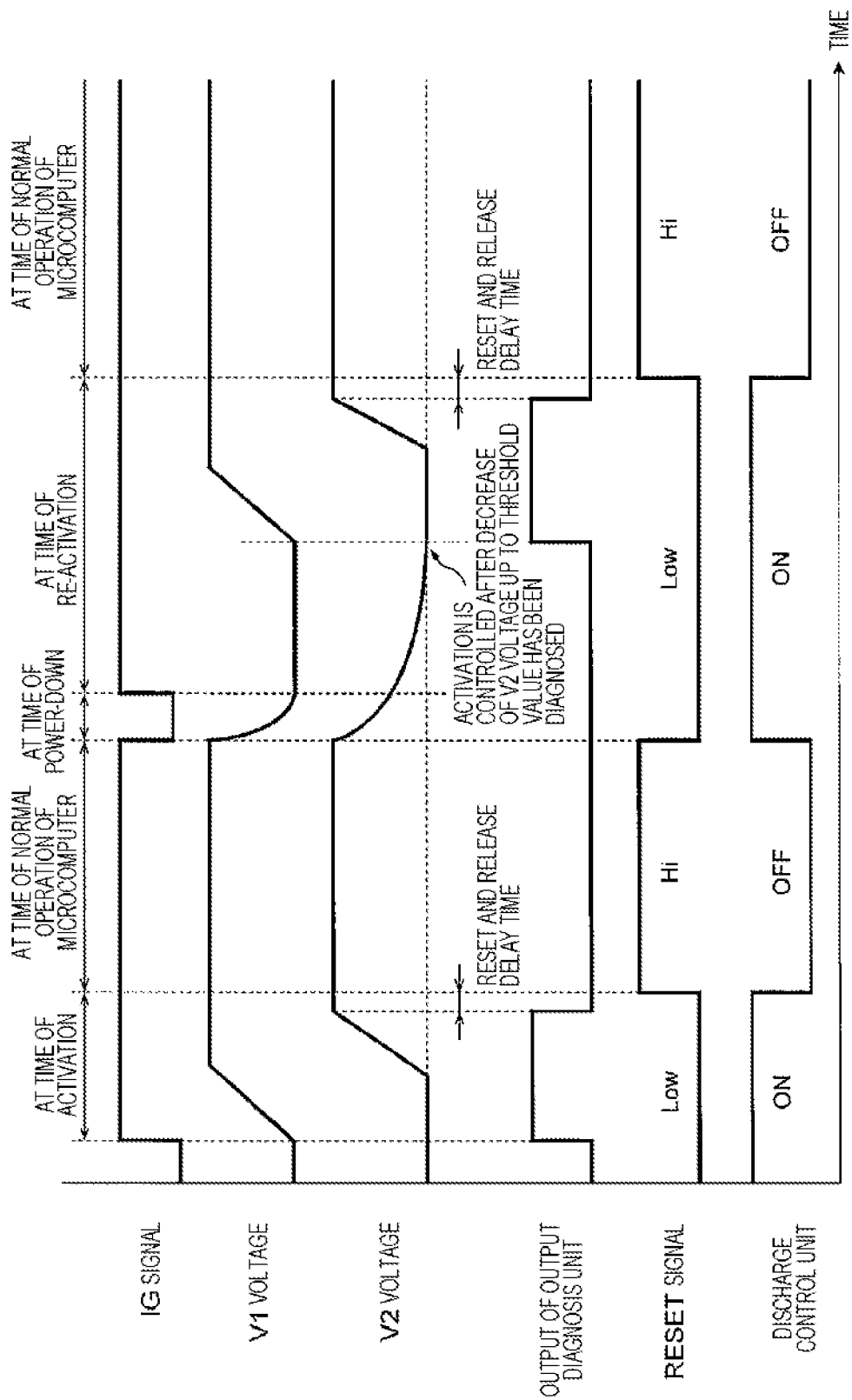

PREVENTING SUPPLY OF POWER TO A MICROCOMPUTER OF AN ELECTRONIC CONTROL DEVICE UNTIL CAPACITORS ARE DISCHARGED

TECHNICAL FIELD

The present invention relates to an electronic control device.

BACKGROUND ART

A power supply voltage is supplied to a microcomputer used for an electronic control device. For example, when a plurality of power supply voltages are supplied, voltage levels and application sequences of the power supply voltages are determined for each microcomputer. The power supply voltage is generated at a desired voltage level or sequence by a power supply IC or the like and then is supplied to the microcomputer, and thus the microcomputer can be normally operated.

However, when the voltage level of the power supply voltage is different from a desired level or the activation sequence of the plurality of power supply voltages is different from a desired sequence, a problem that the microcomputer does not normally activate may occur. Here, a capacitor for stabilizing the power supply voltage is generally attached to an output terminal that outputs the power supply voltage. The power supply voltage is gradually discharged depending on a value of the connected capacitor and a connected resistor, at time of power-down or the like. However, if the time at which the power is down is short, the microcomputer is re-activated before the voltage of the power supply voltage sufficiently decreases, and thus the microcomputer may not be possible to execute a normal shutdown process, or the activation sequence of the desired power supply voltage is not followed, and thus the microcomputer may not be activated or may not operate normally.

As described above, in order to complete a power-down process of the microcomputer at the time of power-down, to execute the activation sequence of the desired power supply voltage at the time of the next re-activation, and to supply the power supply voltage to the microcomputer, the power supply voltage used in the microcomputer needs to be quickly and reliably discharged at the time of power-down.

Here, as a technique for discharging the power supply voltage in the related art, there is a technique as disclosed in PTL 1. PTL 1 discloses the contents as follows. "A force initialization circuit of an electronic control device includes: a power supply current limiting circuit that is connected in series between a power supply input terminal and a high-potential side terminal of a DC power supply, and controls the limitation of a power supply current, and a power-source input terminal grounding circuit that connects the power supply input terminal to GND. When a first operation signal is input to the power supply current limiting circuit from an outside, the power supply current limiting circuit limits the power supply current. When a second operation signal is input to the power-source input terminal grounding circuit in a state where the power supply current is limited, the power-source input terminal grounding circuit connects the power supply input terminal and GND to each other, and the connection is released after a predetermined time, so that initialization is performed in a manner that internal electric charges are discharged during a period when a voltage maintaining circuit maintains a connection state between the power supply input terminal and GND for a predetermined time."

CITATION LIST

Patent Literature

PTL 1: JP 2014-127113 A

SUMMARY OF INVENTION

Technical Problem

According to the technique in PTL 1, necessity of initialization is diagnosed by the microcomputer, and the initialization is performed by forcibly discharging the power supply input terminal. However, in the technique in PTL 1, when the microcomputer does not normally operate, problems that it is not possible to control the initialization, and it is not possible to normally activate the electronic control device occur.

The present invention has been made in view of the above problems, and an object of the present invention is to provide a highly reliable electronic control device capable of reliably causing a microcomputer to perform normal termination and normal re-activation by controlling a power supply voltage.

Solution to Problem

To solve the above problems, according to the present invention, an electronic control device includes a microcomputer, a power supply control unit that controls a power supply voltage of the microcomputer, and a capacitor provided between the power supply control unit and the microcomputer. The power supply control unit includes a power supply unit that supplies the power supply voltage to the microcomputer by turning ON an activation signal for activating the microcomputer, and stops the supply of the power supply voltage by turning the activation signal OFF, a reset control unit that generates a Low reset signal by turning the activation signal OFF, and a discharge control unit that discharges electric charges of the capacitor when acquiring the Low reset signal.

Advantageous Effects of Invention

According to the present invention, it is possible to provide a highly reliable electronic control device capable of reliably causing a microcomputer to perform normal termination and normal re-activation by controlling a power supply voltage. Further features relating to the present invention will become apparent from the description of the specification and the accompanying drawings. In addition, objects, configurations, and advantageous effects other than those described above will be clarified by the descriptions of the following embodiments.

BRIEF DESCRIPTION OF DRAWINGS

FIG. 5 is a timing chart illustrating an example of output timings of various signals.

FIG. 6 is a timing chart illustrating another example of the output timings of the various signals.

DESCRIPTION OF EMBODIMENTS

Figure 1:
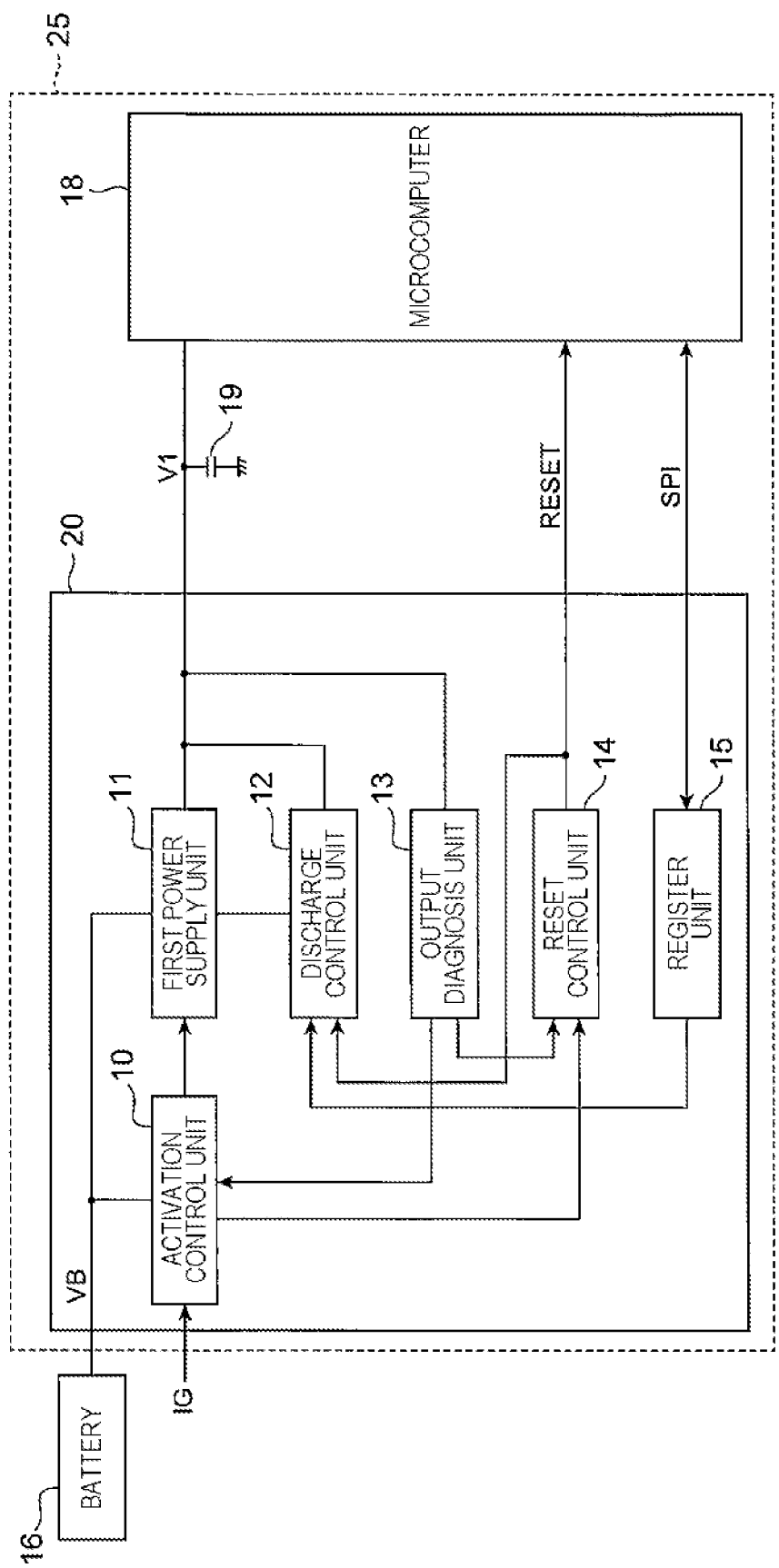
FIG. 1 is a schematic diagram illustrating an example of a configuration of an electronic control device according to a first embodiment.

Hereinafter, embodiments of the present invention will be described with reference to the drawings. In the drawings, the same components are denoted by the same reference signs, and the detailed description of the repetitive parts will be omitted. The configuration diagrams of FIGS. 1 to 4 and the flowcharts of FIGS. 5 and 6 are examples of embodiments according to the present invention, and do not limit claims.

First Embodiment

FIG. 1 is a schematic diagram illustrating an example of a configuration of an electronic control device according to a first embodiment. An electronic control device 25 shows a minimum circuit configuration for describing the configuration of the present embodiment.

The electronic control device 25 is an ECU mounted on a vehicle such as an automobile, for example. As illustrated in FIG. 1, the electronic control device 25 includes a power supply control unit 20 and a microcomputer 18. A battery 16 is connected to the power supply control unit 20, and thus a battery voltage VB as a power supply voltage is supplied to the power supply control unit 20. The microcomputer 18 is connected to the power supply control unit 20. The power supply control unit 20 is a power supply IC that performs control when supplying a power supply voltage to the microcomputer 18. The microcomputer 18 includes a CPU and an LSI (integrated circuit) that control the operation of the electronic control device 25.

The power supply control unit 20 includes an activation control unit 10, a first power supply unit 11, an output diagnosis unit 13, a reset control unit 14, a discharge control unit 12, and a register unit 15. The constituent units are classified for easy understanding of processing performed by the power supply control unit 20, and include electronic circuits or electronic components. The discharge control unit 12, the output diagnosis unit 13, and the reset control unit 14 are configured by the respective electronic circuits (discharge circuit, diagnosis circuit, and reset circuit). Specific configuration examples and operations of the circuits will be described in detail in a fourth embodiment described later.

The activation control unit 10 is connected to an ignition switch (not illustrated) so that an ignition signal IG which is an activation signal of the electronic control device is input to the activation control unit 10. The activation control unit 10 controls the supply of the power supply voltage to the microcomputer 18 based on the input of the ignition signal IG being the activation signal of the electronic control device 25.

The first power supply unit 11 generates a first power supply voltage V1 to be supplied to the microcomputer 18, under the control of the activation control unit 10. The first power supply unit 11 generates a power supply voltage by using the power supplied from the battery 16. The first power supply unit 11 is configured by a regulator that adjusts the battery voltage VB to a predetermined value. A capacitor 19 is provided between the first power supply unit 11 and the microcomputer 18, specifically, at an output terminal of the power supply control unit 20 that outputs the first power supply voltage V1 to the microcomputer 18. The capacitor 19 has a function of supplying a stable voltage to the microcomputer 18 even when a steep load variation of a current occurs.

The output diagnosis unit 13 is connected to the output side of the first power supply unit 11, and diagnoses whether the first power supply voltage V1 generated by a power supply unit (first power supply unit 11 in the present embodiment) is a normal voltage. The output diagnosis unit 13 diagnoses whether the power supply voltage supplied to the microcomputer 18 is lower than a threshold value set in advance. The output diagnosis unit 13 outputs the diagnosis result to the reset control unit 14. The reset control unit 14 generates a reset signal for controlling the activation of the microcomputer 18, in accordance with the diagnostic result of the output diagnosis unit 13. Then, the reset control unit 14 outputs the reset signal to the microcomputer 18 and the discharge control unit 12.

The discharge control unit 12 performs control to discharge the power supply voltage supplied to the microcomputer 18. The discharge control unit 12 performs control to discharge electric charges of the capacitor 19 by the reset signal output from the reset control unit 14. The register unit 15 performs serial peripheral interface (SPI) communication with the microcomputer 18 to set the operation of the discharge control unit 12. The register unit 15 is configured by a circuit or a storage element that stores predetermined information.

Next, an operation of the electronic control device 25 at the start of activation will be described.

First, if acquiring an ignition signal IG (ON signal) for activating the electronic control device 25, the activation control unit 10 outputs a signal for turning ON the first power supply unit 11. When the signal for turning ON the first power supply unit 11 is input from the activation control unit 10 to the first power supply unit 11, the first power supply unit 11 adjusts the battery voltage VB to generate a predetermined first power supply voltage V1 to be supplied to the microcomputer 18, and supplies the generated first power supply voltage V1 to the microcomputer 18.

When acquiring a signal indicating that the first power supply voltage V1 to be supplied to the microcomputer 18 sufficiently decreases, from the output diagnosis unit 13, the activation control unit 10 outputs the signal for turning ON the first power supply unit 11, and causes the first power supply unit 11 to supply the power supply voltage. When the first power supply voltage V1 is lower than the predetermined threshold value (for example, about 0 (zero)), the output diagnosis unit 13 outputs the signal indicating that the first power supply voltage V1 sufficiently decreases, to the activation control unit 10. When not acquiring the signal indicating that the power supply voltage to be supplied to the microcomputer 18 sufficiently decreases, from the output diagnosis unit 13, the activation control unit 10 does not output the signal for turning ON the first power supply unit 11, and prohibits the supply of the power supply voltage by the first power supply unit 11.

When the first power supply unit 11 is turned ON, the output diagnosis unit 13 diagnoses whether the first power supply voltage V1 generated by the first power supply unit 11 is a voltage within a normal output range. When it is determined that the first power supply voltage V1 is within the normal output range, the output diagnosis unit 13 outputs an instruction signal for generating a Hi reset signal to the reset control unit 14.

When acquiring the instruction signal, the reset control unit 14 changes the reset signal from Low to Hi, and outputs the Hi reset signal to the microcomputer 18. When acquiring the Hi reset signal, the microcomputer 18 releases a stop state and receives the supply of the power supply voltage to start a normal operation. The electronic control device 25 is normally activated by a series of operations of the power supply control unit 20 and the microcomputer 18 as described above.

Next, an operation of the electronic control device 25 at the time of power-down, which is at the time of the activation termination of the electronic control device 25, will be described.

First, when acquiring an ignition signal IG (OFF) for terminating activation of the electronic control device 25, the activation control unit 10 performs control to turn the first power supply unit 11 OFF. The first power supply unit 11 stops the generation of the first power supply voltage V1 by OFF control from the activation control unit 10. Thus, the supply of the first power supply voltage V1 to the microcomputer 18 is stopped, and the microcomputer 18 stops the activation. As a signal for starting the power-down, that is, the signal for terminating the activation of the electronic control device 25, the ignition signal IG (OFF) may be used, or the microcomputer 18 may output and control a signal for turning OFF the function of the power supply control unit 20 to hold the power supply.

In addition, at the start of power-down, the activation control unit 10 outputs an instruction signal for generating a Low reset signal, to the reset control unit 14 together with an OFF operation of the first power supply unit 11. When acquiring the instruction signal, the reset control unit 14 generates a Low reset signal and outputs the generated reset signal to the microcomputer 18 and the discharge control unit 12.

When acquiring the Low reset signal, the discharge control unit 12 starts discharge control for discharging the electric charges accumulated in the capacitor 19. By such discharge control, the electric charges accumulated in the capacitor 19 are discharged, the first power supply voltage V1 rapidly decreases, and thus it is possible to quickly and reliably make the power supply voltage of the microcomputer zero.

Generally, the microcomputer stops the control of software by the reset signal at the time of power-down. In a state where the power supply voltage is not completely discharged, some functions of internal hardware such as a bias voltage, a bias current, or an oscillator continue to operate due to the remaining power supply voltage, and the various functions stop the operation by detecting a decrease in the power supply voltage, and power-down of the microcomputer is completed.

However, in a case of a device in which discharge control for forcibly discharging the first power supply voltage V1 is not performed as in an electronic control device that does not include the discharge control unit 12 in the related art, the first power supply voltage V1 is slowly and naturally discharged over time by a large time constant determined by a parasitic capacitance component and a parasitic resistance component in a capacitor connected to the output side of the power supply voltage and in an electronic circuit. Therefore, it takes a long time to complete the power-down of the microcomputer.

If the ignition signal IG (ON) is input again before the natural discharge is completed, the power supply control device is re-activated, and the first power supply voltage V1 is supplied to the microcomputer under the control of the power supply control unit. At this time, the microcomputer may not be able to complete the power-down sequence. When the power-down sequence of the microcomputer is not completed, a problem that it is not possible to perform a normal activation sequence at the next activation may occur.

On the other hand, the power supply control unit 20 according to the present embodiment performs discharge control for discharging the first power supply voltage V1 during a period when the Low reset signal is output at the time of power-down. In addition, the activation control unit 10 performs control so that the power supply control unit 20 is not activated regardless of whether the ignition signal IG is input, when the signal indicating that the first power supply voltage V1 sufficiently decreases (signal indicating the completion of discharge) is not output from the output diagnosis unit 13, that is, until the output diagnosis unit 13 diagnoses that the discharge of the first power supply voltage V1 is completed.

The discharge control unit 12 can also perform discharge based on a control signal from the register unit 15 that performs SPI communication with the microcomputer 18. That is, the electronic control device 25 can perform the discharge control via the register unit 15 not only when the Low reset signal is output but also via the SPI communication with the microcomputer 18. An effect of such discharge will be described in detail in a third embodiment described later.

With the series of control described above, the power supply control unit 20 causes the capacitor 19 to be completely discharged at the time of power-down of the microcomputer 18 so as to reliably complete the sequence, and thus cause the microcomputer 18 to be normally activated at the time of re-activation.

In the electronic control device 25 according to the present embodiment, the discharge control unit 12 is connected to the output of the first power supply unit 11. Thus, when the reset control unit 14 outputs a Low reset signal, the discharge control unit 12 performs the discharge control of the capacitor 19. The output diagnosis unit 13 diagnoses a sufficient decrease in the first power supply voltage V1 and permits the next activation of the activation control unit 10. Thus, it is possible to complete the sequence of reliable power-down of the microcomputer 18 and reliably re-activate the microcomputer 18 in the next time.

According to the electronic control device 25 in the present embodiment, by quickly and reliably discharging the power supply voltage supplied to the microcomputer 18 at the time of power-down, it is possible to normally terminate the microcomputer 18 and to normally activate the microcomputer 18 at the time of re-activation.

In addition, by setting the power supply voltage for driving the discharge control unit 12 to the battery voltage VB different from the first power supply voltage V1, it is possible to completely discharge the power supply voltage remaining in the capacitor 19 to 0 (zero) without being affected by the decrease in the first power supply voltage V1.

Second Embodiment

Figure 2:
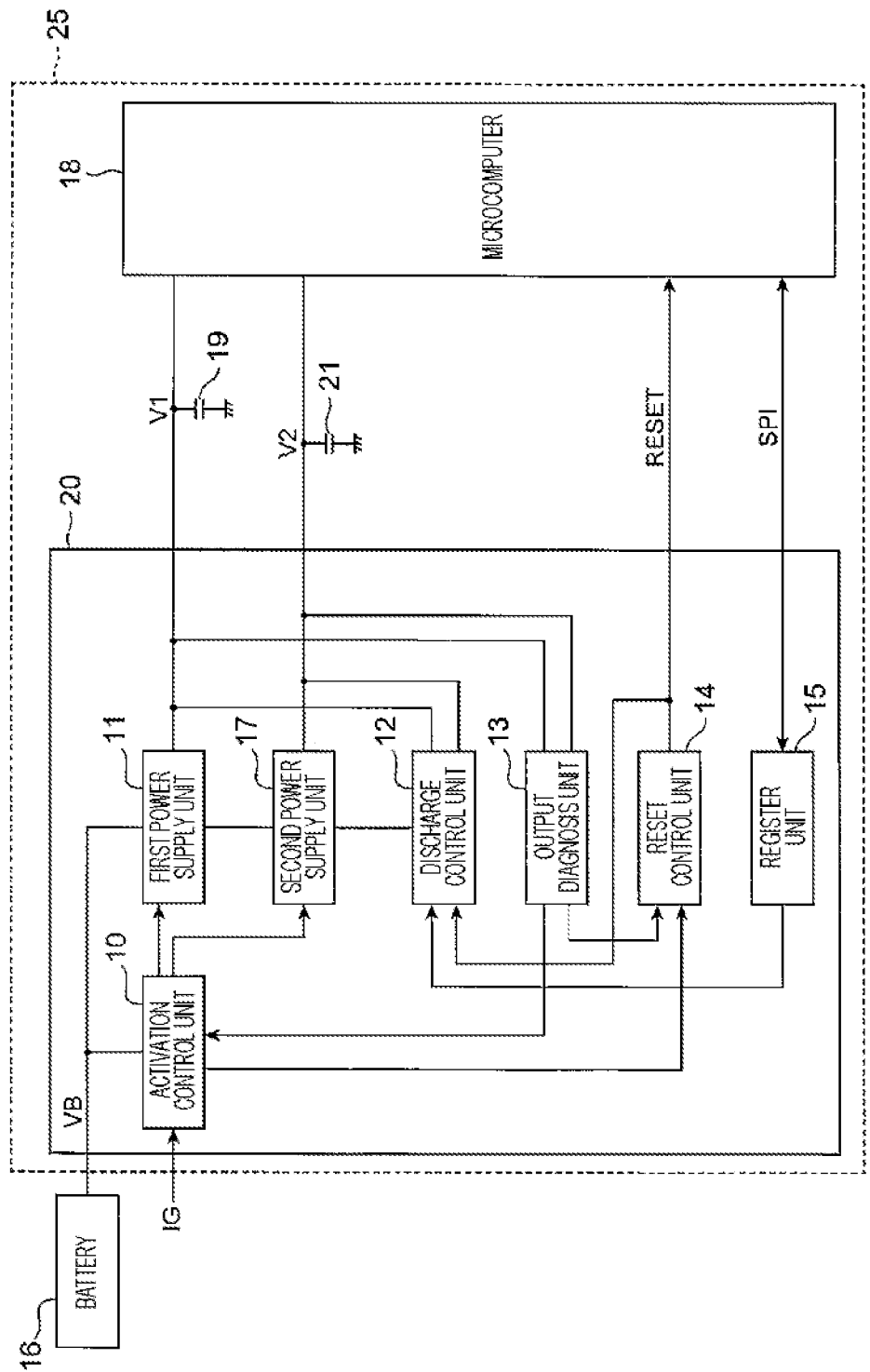
FIG. 2 is a schematic diagram illustrating an example of a configuration of an electronic control device according to a second embodiment.

Next, an electronic control device according to a second embodiment of the present invention will be described with reference to FIGS. 2, 5, and 6. FIG. 2 is a schematic diagram illustrating an example of a configuration of the electronic control device according to the second embodiment.

An electronic control device 25 according to the present embodiment has a circuit configuration in which a second power supply unit 17 is further added to the circuit configuration illustrated in FIG. 1. In the following description, components, operations, and effects similar to those of the first embodiment will be omitted, and components different from those of the first embodiment and operations and effects related thereto will be described in detail.

The second power supply unit 17 generates a power supply voltage to be supplied to a microcomputer 18 separately from the first power supply unit 11. Similarly to the first power supply unit 11, the second power supply unit 17 generates a second power supply voltage V2 to be supplied to the microcomputer 18 by using the battery voltage VB under the control of the activation control unit 10. The second power supply unit 17 is configured by a regulator that adjusts the battery voltage VB to a predetermined value.

In addition, a capacitor 21 is provided between the second power supply unit 17 and the microcomputer 18, specifically, at an output terminal of a power supply control unit 20 that outputs the second power supply voltage V2 to the microcomputer 18. The capacitor 21 has a function of supplying a stable voltage to the microcomputer 18 even when a steep load variation of a current occurs. A configuration in which a discharge control unit 12 and an output diagnosis unit 13 are connected to each of the first power supply unit 11 and the second power supply unit 17 is made.

The microcomputer 18 operates by receiving supply of a plurality of different power supply voltages. In the microcomputer 18, a power supply sequence which is the order of receiving the supply of the plurality of power supply voltages at the time of activation is determined in advance. Therefore, the power supply control unit 20 needs to generate the plurality of power supply voltages in the requested order and supply the generated power supply voltages to the microcomputer 18. When the predetermined power supply sequence is not followed, a problem, for example, that it is not possible to normally activate the microcomputer 18 may occur.

In the power supply control unit 20 in the present embodiment, the activation control unit 10 performs control so that the first power supply unit 11 outputs the first power supply voltage V1 first, and then the second power supply unit 17 outputs the second power supply voltage V2. The activation control unit 10 performs control so that, first, the first power supply unit 11 generates and outputs the first power supply voltage V1, and then the second power supply unit 17 generates and outputs the second power supply voltage V2, in accordance with the power supply sequence.

Similarly to the first embodiment, the discharge control unit 12 performs discharge control for discharging both the first power supply voltage V1 and the second power supply voltage V2 when acquiring a Low reset signal from the reset control unit 14 or under the control of the register unit 15. Similarly to the first embodiment, the output diagnosis unit 13 diagnoses whether all the first power supply voltage V1 and the second power supply voltage V2 have sufficiently decreased at the time of power-down. When the first power supply voltage V1 and the second power supply voltage V2 are lower than a first threshold value and a second threshold value, which are set in advance, respectively, the output diagnosis unit 13 diagnoses that the first power supply voltage V1 and the second power supply voltage V2 have sufficiently decreased.

The activation control unit 10 stops the next power supply activation control regardless of whether the ignition signal IG is received, until the output diagnosis unit 13 diagnoses that the power supply voltage has sufficiently decreased. That is, when a signal indicating that the first power supply voltage V1 and the second power supply voltage V2 sufficiently decrease (signal indicating the completion of discharge) is not output from the output diagnosis unit 13, the activation control unit 10 prohibits the activation of first power supply unit 11 and the second power supply unit 17. When the output diagnosis unit 13 diagnoses that the power supply voltage has sufficiently decreased, the activation control unit 10 cancels the prohibition of the activation of the first power supply unit 11 and the second power supply unit 17, and activates the first power supply unit 11 and the second power supply unit 17 by receiving the input of the ignition signal IG (ON).

That is, when the diagnosis unit 13 diagnoses that at least one of a case where the first power supply voltage V1 is equal to or higher than the first threshold value and a case where the second power supply voltage V2 is equal to or higher than the second threshold value has occurred, the activation control unit 10 prohibits the supply of the first power supply voltage V1 by the first power supply unit 11 and the supply of the second power supply voltage V2 by the second power supply unit 17. In addition, when the output diagnosis unit 13 diagnoses that the first power supply voltage V1 is lower than the first threshold value set in advance, and the second power supply voltage V2 is lower than the second threshold value set in advance, the activation control unit 10 permits the supply of the first power supply voltage V1 by the first power supply unit 11 and the supply of the second power supply voltage V2 by the second power supply unit 17.

Here, timings of the ignition signal IG, the first power supply voltage V1, the second power supply voltage V2, the reset signal, and the discharge control by the discharge control unit 12 will be described.

FIGS. 5 and 6 are timing charts illustrating examples of output timings of various signals in the electronic control device according to the second embodiment. The timing charts indicate the timings of various signals from the input of the ignition signal IG (OFF) to the power-down of the electronic control device 25 and then from the input again of the ignition signal IG (ON) to the re-activation of the electronic control device 25.

FIG. 5 is a timing chart when the ignition signal IG (ON) is input after the electronic control device 25 is powered down and the voltage sufficiently decreases by a discharge control operation. FIG. 6 is a timing chart when the ignition signal IG (ON) is input immediately after the electronic control device 25 is powered down.

As illustrated in FIG. 5, when the ignition signal IG (ON) is input, the first power supply voltage V1 and the second power supply voltage V2, which have predetermined voltage values, are normally generated in the order of the first power supply voltage V1 and the second power supply voltage V2. When the output diagnosis unit 13 diagnoses that the first power supply voltage V1 and the second power supply voltage V2 have voltage values in the normal output range, the reset control unit 14 changes the reset signal to be output from Low to Hi. Thus, the normal operation of the microcomputer 18 is started.

A reset release delay time is provided between a timing at which the first power supply voltage V1 and the second power supply voltage V2 have the voltage values in the normal output range and a timing at which the reset signal output by the reset control unit 14 is changed from Low to Hi. The reset release delay time is set in advance, as a time from when the first power supply voltage V1 is supplied to the microcomputer 18 until the operation of the microcomputer becomes stable. The reset control unit 14 outputs a Hi reset signal to the microcomputer 18 after the reset release delay time (for example, 10 ms) has elapsed.

The discharge control unit 12 discharges the first power supply voltage V1 and the second power supply voltage V2 when a Low reset signal is output, and stops discharging (turns OFF) when the reset signal becomes Hi. As described above, it is possible to prevent wasteful power consumption by stopping the discharge when the reset signal is Hi.

When the electronic control device 25 is powered down by the input of the ignition signal IG (OFF), generation of the first power supply voltage V1 and the second power supply voltage V2 by the first power supply unit 11 and the second power supply unit 17 is stopped, and outputs of the first power supply voltage V1 and the second power supply voltage V2 are stopped. Thus, the decrease in the voltage values thereof is started.

The reset control unit 14 changes the reset signal to be output from Hi to Low at a timing at which the ignition signal IG (OFF) is input. When there is no setting of discharge control from the microcomputer 18, that is, when there is no command signal for the discharge control from the microcomputer 18 to the register unit 15, the discharge control unit 12 starts discharging (turns ON) by the output of the Low reset signal at the time of power activation and the time of power-down.

A broken line in FIG. 5 indicates the waveform of the second power supply voltage V2 at the time of power-down in the case of the electronic control device that does not include the discharge control unit and the output diagnosis unit, in the related art. When the ignition signal IG is switched from ON to OFF, electric charges stored in the capacitor 21 connected between the second power supply unit 17 and the microcomputer 18 are gradually discharged, and the second power supply voltage V2 decreases. When the ignition signal IG (ON) for the re-activation is input before the voltage completely drops to 0, that is, before the natural discharge is completed, the second power supply voltage V2 is supplied to the microcomputer 18 following the first power supply voltage V1.

However, since the discharge of the second power supply voltage V2 of the capacitor 21 is not completely completed, in addition to a point that a power-down sequence of the microcomputer 18 is not completed, a power supply sequence in which the order of the power being supplied is the order from the second power supply voltage V2 to the first power supply voltage V1 is made, and thus the normal activation of the microcomputer is performed without a prescribed power supply sequence.

As in the timing chart illustrated in FIG. 6, even when the ignition signal IG is input immediately after the power-down, with the configuration of the present embodiment, quick discharge control at the time of power-down and re-activation control by diagnosis of a sufficient decrease in the power supply voltage by the output diagnosis unit 13 are performed. Thus, it is possible to reliably execute a power-down process of the microcomputer 18 and to perform the normal power supply sequence to the microcomputer 18 at the time of re-activation. Thus, it is possible to provide an electronic control device that has high reliability and ensure the activation of the microcomputer 18 and the normal operation at the time of power-down.

In the present embodiment, the case of the configuration in which the two power supply voltages V1 and V2 of the first power supply unit 11 and the second power supply unit 17 are supplied to the microcomputer 18 has been described as an example. With a configuration having three or more power supply units, it is similarly possible to achieve the similar effect by implementing the present invention.

Third Embodiment

Figure 3:
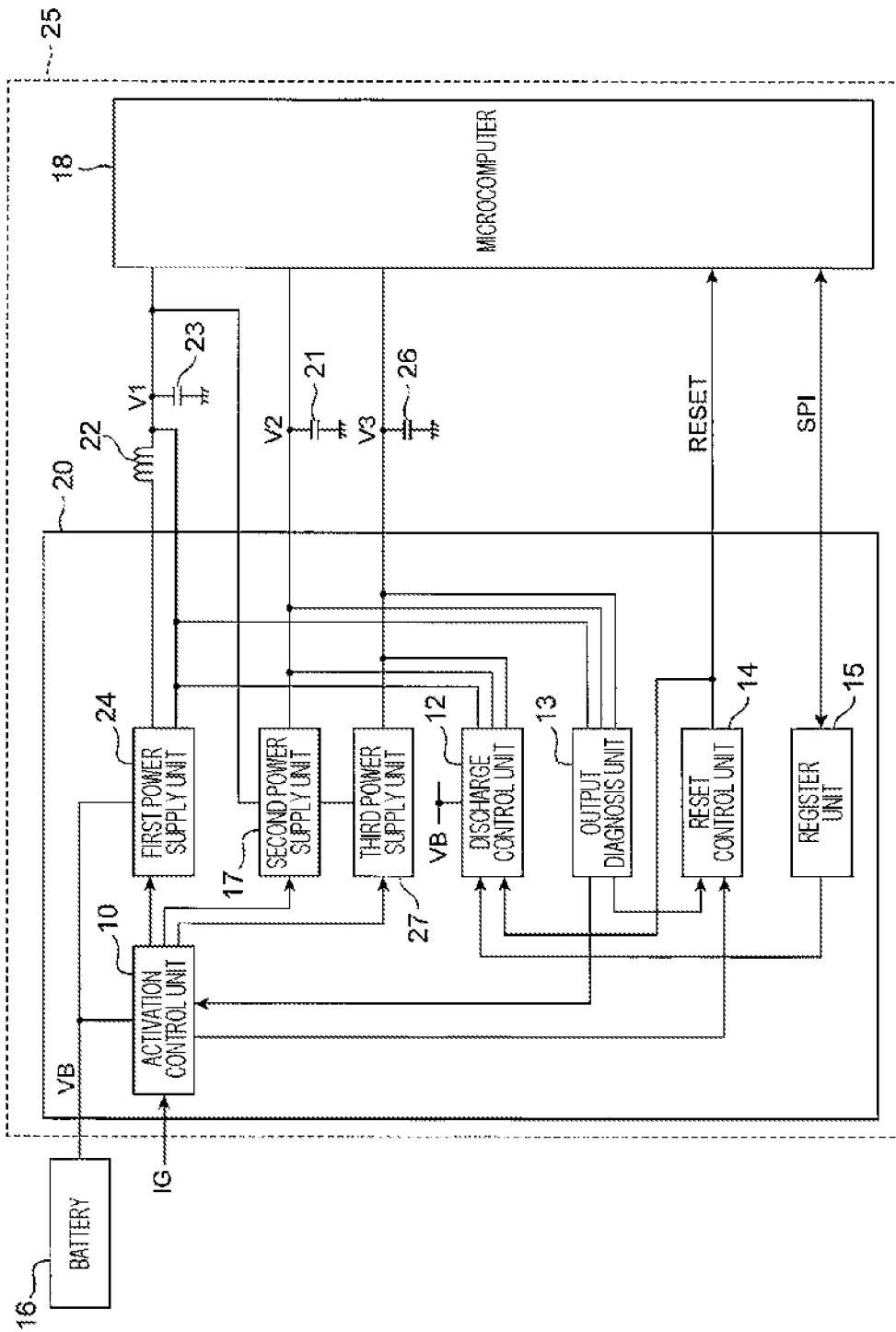
FIG. 3 is a schematic diagram illustrating an example of a configuration of an electronic control device according to a third embodiment.

Next, an electronic control device according to a third embodiment of the present invention will be described with reference to FIG. 3. FIG. 3 is a schematic diagram illustrating an example of a configuration of the electronic control device according to the third embodiment.

The electronic control device 25 according to the present embodiment is characterized in that a step-down switching regulator is used as a first power supply unit 24 instead of the first power supply unit 11 in the first embodiment. The step-down switching regulator is configured by a step-down DC-DC converter, and performs power conversion from an input to an output by a switching operation. An inductor 22 is connected to a switch output of the step-down switching regulator.

The power supply control unit 20 includes an integrated circuit in which the first power supply unit 24, a second power supply unit 17, and a discharge control unit 12 are integrated.

The second power supply unit 17 is configured to generate a second power supply voltage V2 from a first power supply voltage V1 of the first power supply unit 24 instead of generating a power supply voltage by using the power supply supplied from the battery 16 as in the first and second embodiments. Similarly, a third power supply unit 27 is also configured to generate a third power supply voltage V3 from the first power supply voltage V1 of the first power supply unit 24.

Similarly to the first and second embodiments, a discharge control unit 12 uses a voltage different from the output voltage of the power supply unit, specifically, the battery voltage VB of the battery 16 as a drive power supply.

The power supply control unit 20 is configured to generate the first power supply voltage V1 from the battery voltage VB by a step-down operation of the step-down switching regulator and then output the generated voltage to the microcomputer 18, so that it is possible to improve the power efficiency of the power supply control unit 20 and to reduce the power consumption of the electronic control device 25.

In general, the step-down switching regulator can generate a power supply voltage with high efficiency by power conversion, and thus is used for a large current drive application. On the other hand, in a case where a current load is small, it is relatively difficult to generate a stable output voltage by the switching operation. Thus, power supply control compatible with a load from a low current to a large current is performed by switching a control method between a case of a large current load and a case of a low current load.

In the present embodiment, the discharge control unit 12 performs discharge control for discharging the power supply voltages V1 to V3, when the reset signal from the reset control unit 14 is Low or when the register unit 15 receives a discharge control command from the microcomputer 18. During a discharge operation at the time of power-down, the power supply units 24, 17, and 27 are turned OFF (stop the operation).

On the other hand, during a period when the reset signal is Low at the time of power activation, the discharge control is performed by turning ON the discharge control unit 12. Thus, the load current of each of the power supply units 24, 17, and 27 increases. Here, during the Low reset signal, the microcomputer 18 basically stops operating, and the current consumption is extremely smaller than that during the normal operation. The first power supply unit 24 being the step-down switching regulator needs to output a stable voltage even in a period in which the reset signal is Low, but, if the current load is extremely small, it may be difficult to perform control for outputting a stable voltage.

Therefore, in the present embodiment, the current load is increased by performing the discharge control during the period in which the reset signal at the time of activation is Low, which contributes to the stable operation of the first power supply unit 24 being the step-down switching regulator. The operation of the step-down switching regulator is stabilized by increasing the current load. In addition, the similar effect is obtained not only at the time of activation but also when the reset signal is switched to Low, and the load current of the microcomputer 18 is reduced. Furthermore, even when the discharge setting is made from the register unit 15 of the microcomputer 18, this contributes to increasing the load current and stably operating the step-down switching regulator.

In the configuration illustrated in FIG. 3, the case of the configuration in which the power supply voltages of the second power supply unit 17 and the third power supply unit 27 are supplied from the first power supply voltage V1 has been described as an example. A configuration in which the power supply voltages of the second power supply unit 17 and the third power supply unit 27 are directly supplied from the battery voltage VB may be made, and the similar effect can be obtained in such a case.

Fourth Embodiment

Figure 4:
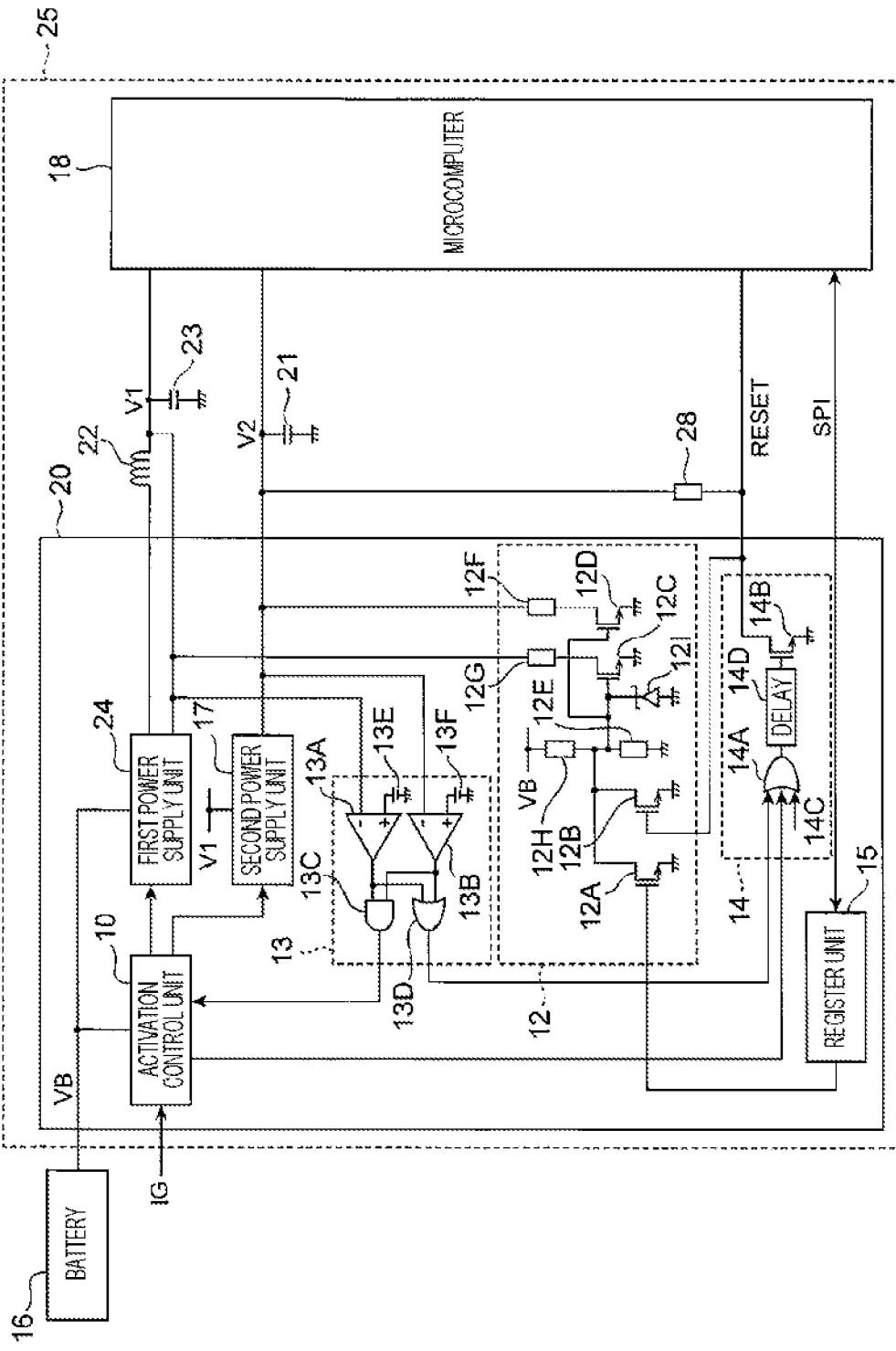
FIG. 4 is a schematic diagram illustrating an example of a configuration of an electronic control device according to a fourth embodiment.

Next, an electronic control device according to a fourth embodiment of the present invention will be described with reference to FIG. 4. FIG. 4 is a schematic diagram illustrating an example of a configuration of the electronic control device according to the fourth embodiment.

The electronic control device 25 according to the present embodiment is obtained by removing the component of the third power supply unit 27 from the configuration of the third embodiment illustrated in FIG. 3. FIG. 3 illustrates the detailed configuration of the discharge control unit 12, the output diagnosis unit 13, and the reset control unit 14. The detailed configuration illustrate an example of the configuration of the embodiment, and do not limit the configuration of the present invention.

First, a discharge control unit 12 is configured by a discharge circuit including Nch-MOSFETs 12A, 12B, 12C, and 12D, resistors 12E, 12F, 12G, and 12H, and a Zener diode 12I. The discharge circuit uses the battery voltage VB as a drive power supply. During a normal operation, a reset signal or a control signal from a register unit 15 is Hi, and either or both of the Nch-MOSFETs 12A and 12B are turned ON. Thus, the gate voltages of the Nch-MOSFETs 12C and 12D that control the discharge operation become zero, and the discharge operation is turned OFF.

Conversely, when the reset signal is Low and the control signal from the register unit 15 is also Low, both of the Nch-MOSFETs 12A and 12B are turned OFF, and voltages obtained by dividing the battery voltage VB by the resistors 12H and 12E are applied to the gate voltages of the Nch-MOSFETs 12C and 12D to turn Nch-MOSFETs 12C and 12D ON. Thus, the discharge operation is performed. In the discharge operation, a configuration in which the current is limited by the resistance values of the resistors 12G and 12F, and the discharge operation is performed is made, but substitution with ON resistors of the Nch-MOSFETs 12C and 12D can be performed.

In addition, the reset signal being a signal for discharge control, and a signal input unit from the register unit 15 can be configured to stop the discharge control when both the reset signal and the signal from the register unit 15 are Hi, by changing the configuration to a configuration in which the Nch-MOSFETs 12A and 12B are connected in series. The Zener diode 12I is connected for the purpose of protection so as not to exceed the withstand voltages of the Nch-MOSFETs 12C and 12D when the battery voltage becomes high, but can be deleted if not necessary.

An output diagnosis unit 13 includes comparators 13A and 13B, an AND gate 13C, and an OR gate 13D. It is assumed that reference voltages 13E and 13F of the comparators 13A and 13B are switched between values during a normal operation and values at the time of power-down.

During a normal operation when the ignition signal IG is ON, the output diagnosis unit 13 diagnoses whether the first power supply voltage V1 and the second power supply voltage V2 are normal voltages. At this time, the reference voltages 13E and 13F are reference voltages for indicating that the first power supply voltage V1 and the second power supply voltage V2 are normal voltages, respectively. For example, when either one of the reference voltages 13E and 13F is diagnosed as a low voltage, the output of the OR gate 13D becomes Hi, and thus the Nch-MOSFET 14B of the reset control unit 14 is turned ON. In addition, the reset signal becomes Low, and thus the control of the microcomputer 18 is stopped.

On the other hand, at the time of power-down when the ignition signal IG is OFF, the output diagnosis unit 13 diagnoses whether the first power supply voltage V1 and the second power supply voltage V2 have sufficiently decreased. When it is diagnosed that the voltages have sufficiently decreased, the Hi signal is output from the AND gate 13C.

The activation control unit 10 prohibits the activation until the output of the AND gate 13C becomes Hi. At this time, the reference voltages 13E and 13F are set to voltages lower than the voltage setting during the normal operation, and are discharged until the first power supply voltage V1 and the second power supply voltage V2 sufficiently decrease.

The reset control unit 14 includes an OR gate 14A to which a plurality of reset control signals are input, an output Nch-MOSFET 14B, and a delay circuit 14D that delays a signal when the output of the OR gate 14A changes from HI to LOW. In the OR gate 14A, in addition to the signal from the output diagnosis unit 13 and the signal from the activation control unit 10 described in each embodiment described above, there are control signals corresponding to various abnormality diagnoses, and the reset control signal 14C is input from these signals. Further, the reset signal connected to the microcomputer is configured to be output from the reset control unit 14 as an open drain, and is configured to be pulled up to the second power supply voltage V2 by the resistor 28 outside the power supply control unit 20. The output method may be a push-pull configuration.

Although the configuration of the present embodiment is an example of a specific example of the present invention, it is possible to obtain similar effects according to the present invention by adopting similar configurations in the first to third embodiments.

An electronic control device 25 according to the present invention (1) including: a microcomputer 18, a power supply control unit 20 that controls a first power supply voltage V1 of the microcomputer 18, and a capacitor 19 provided between the power supply control unit 20 and the microcomputer 18, in which the power supply control unit 20 includes a first power supply unit 11 that supplies the first power supply voltage V1 to the microcomputer 18 by ON of an ignition signal IG for activating the microcomputer 18, and stops the supply of the first power supply voltage V1 by OFF of the ignition signal IG, a reset control unit 14 that generates a Low reset signal by OFF of the ignition signal IG, and a discharge control unit 12 that discharges electric charges of the capacitor 19 when acquiring the Low reset signal.

According to the electronic control device of the present invention (1), the supply of the first power supply voltage V1 from the first power supply unit 11 is stopped at the time of power-down by OFF of the ignition signal IG, and the reset control unit 14 generates the Low reset signal. Then, the discharge control unit 12 performs discharge control for discharging the electric charges of the capacitor 19 when acquiring the Low reset signal. Thus, it is possible to quickly and reliably discharge the power supply voltage supplied to the microcomputer 18 at the time of power-down, and it is possible to normally terminate the microcomputer 18 and normally activate the microcomputer at the time of re-activation.

The electronic control device according to the present invention (2) further including: an activation control unit 10 that controls activation of the microcomputer 18 based on the ignition signal IG, and an output diagnosis unit 13 that diagnoses whether the first power supply voltage V1 supplied to the microcomputer 18 is lower than a threshold value set in advance, when the ignition signal IG is switched from OFF to ON, in which the activation control unit 10 prohibits the supply of the first power supply voltage V1 by the first power supply unit 11 when the output diagnosis unit 13 diagnoses that the first power supply voltage V1 is equal to or higher than the threshold value, and permits the supply of the first power supply voltage V1 by the first power supply unit 11 when it is diagnosed that the first power supply voltage V1 is lower than the threshold value.

According to the electronic control device of the present invention (2), when the ignition signal IG is switched from OFF to ON, the output diagnosis unit 13 diagnoses whether or not the first power supply voltage V1 supplied to the microcomputer 18 is lower than the threshold value set in advance. Then, the activation control unit 10 performs control to prohibit the supply of the first power supply voltage V1 by the first power supply unit 11 when it is diagnosed that the first power supply voltage V1 is equal to or higher than the threshold value, and to permit the supply of the first power supply voltage V1 by the first power supply unit 11 when it is diagnosed that the first power supply voltage V1 is lower than the threshold value.

Thus, the output diagnosis unit 13 diagnoses a sufficient decrease in the first power supply voltage V1 and permits the next activation of the activation control unit 10. Thus, it is possible to complete the sequence of reliable power-down of the microcomputer 18 and reliably re-activate the microcomputer 18 in the next time.

The electronic control device according to the present invention (3), in which the power supply unit includes a first power supply unit 11 that supplies a first power supply voltage V1 to the microcomputer 18 and a second power supply unit 17 that supplies a second power supply voltage V2 to the microcomputer 18, the capacitor includes a first capacitor 19 provided between the first power supply unit 11 and the microcomputer 18 and a second capacitor 21 provided between the second power supply unit 17 and the microcomputer 18, and the discharge control unit 12 discharges electric charges of the first capacitor 19 and electric charges of the second capacitor 21 when acquiring a Low reset signal from the reset control unit 14.

According to the electronic control device of the present invention (3), the power supply unit includes the first power supply unit 11 and the second power supply unit 17, the capacitor includes the first capacitor 19 and the second capacitor 21, and the electric charge of the first capacitor 19 and the electric charge of the second capacitor 21 are discharged when the Low reset signal is acquired from the reset control unit 14. Thus, it is possible to quickly and reliably discharge both the first capacitor 19 and the second capacitor 21 at the time of power-down. Thus, it is possible to reliably complete the sequence of the microcomputer 18 at the time of power-down and to perform a normal power supply sequence to the microcomputer 18 at the time of re-activation.

The electronic control device according to of the present invention (4), in which, when the ignition signal IG is switched from OFF to ON, the output diagnosis unit 13 diagnoses whether the first power supply voltage V1 is lower than a first threshold value set in advance and the second power supply voltage V2 is lower than a second threshold set in advance, and the activation control unit 10 prohibits the supply of the first power supply voltage V1 by the first power supply unit 11 and the supply of the second power supply voltage V2 by the second power supply unit 17 when the output diagnosis unit 13 diagnoses that at least one of a case where the first power supply voltage V1 is equal to or higher than the first threshold value and a case where the second power supply voltage V2 is equal to or higher than the second threshold value occurs, and permits the supply of the first power supply voltage V1 by the first power supply unit 11 and the supply of the second power supply voltage V2 by the second power supply unit 17 when the output diagnosis unit 13 diagnoses that the first power supply voltage V1 is lower than the first threshold value set in advance and the second power supply voltage V2 is lower than the second threshold value set in advance.

According to the electronic control device of the present invention (4), when the ignition signal IG is switched from OFF to ON, the output diagnosis unit 13 diagnoses whether the first power supply voltage V1 and the second power supply voltage V2 supplied to the microcomputer 18 are lower than the first threshold value and the second threshold value set in advance, respectively. When it is diagnosed that at least one of the case where the first power supply voltage V1 is equal to or higher than the first threshold value and the case where the second power supply voltage is equal to or higher than the second threshold value, the supply of the first power supply voltage V1 by the first power supply unit 11 and the supply of the second power supply voltage V2 by the second power supply unit 17 are prohibited. Then, when it is diagnosed that the first power supply voltage V1 is lower than the first threshold value and the second power supply voltage V2 is lower than the second threshold value, the activation control unit 10 performs control to permit the supply of the first power supply voltage V1 by the first power supply unit 11 and the supply of the second power supply voltage V2 by the second power supply unit 17. Thus, the output diagnosis unit 13 diagnoses a sufficient decrease in the first power supply voltage V1 and the second power supply voltage V2 and permits the next activation of the activation control unit 10. Thus, it is possible to reliably complete the sequence of the microcomputer 18 at the time of power-down and to perform a normal power supply sequence to the microcomputer 18 at the time of re-activation.

The electronic control device according to the present invention (5), in which the first power supply unit 24 is a switching regulator including a switch that turns ON or OFF the first power supply voltage V1, and is configured to increase a load current on an output side of the switching regulator by a discharge operation of the discharge control unit 12.

According to the electronic control device of the present invention (5), the first power supply unit 24 is configured by the switching regulator, and the load current on the output side of the switching regulator is increased by the discharge of the capacitor 19 by the discharge control unit 12. Thus, it is possible to stabilize the operation of the switching regulator constituting the first power supply unit 24. In addition, it is possible to improve the power efficiency of the power supply control unit 20, and to reduce the power consumption of the electronic control device 25.

The electronic control device of the present invention (6), in which the second power supply unit 17 generates the second power supply voltage V2 by using the first power supply voltage V1 of the first power supply unit 24.

The electronic control device according to the present invention (7), in which the discharge control unit 12 uses a battery voltage VB as a drive power supply.

The electronic control device of the present invention (8) further including: a register unit 15 that outputs a control signal for discharge control to discharge electric charges of the capacitor 19 based on a discharge command from the microcomputer 18, in which the discharge control unit 12 performs control to discharge the charge of the capacitor 19 when acquiring a Low reset signal from the reset control unit 14 or acquiring the control signal for the discharge control from the register unit 15.

Hitherto, although the embodiments of the present invention have been described in detail above, the present invention is not limited to the above-described embodiments, and various design changes can be made without departing from the spirit of the present invention described in the claims. For example, the above embodiments are described in detail in order to explain the present invention in an easy-to-understand manner, and the above embodiments are not necessarily limited to a case including all the described configurations. Further, some components in one embodiment can be replaced with the components in another embodiment, and the configuration of another embodiment can be added to the configuration of one embodiment. Further, regarding some components in the embodiments, other components can be added, deleted, and replaced.

REFERENCE SIGNS LIST 10 activation control unit
11 first power supply unit
12 discharge control unit
12A, 12B, 12C, 12D Nch-MOSFET
12E, 12F, 12G, 12H resistor
12I Zener diode
13 output diagnosis unit
13A, 13B comparator
13C AND gate
13D OR gate
13E, 13F reference voltage
14 reset control unit
14A OR gate
14B Nch-MOSFET
14C reset control signal
14D delay circuit
15 register unit
16 battery
17 second power supply unit
18 microcomputer
19 capacitor
20 power supply control unit
21 capacitor
22 inductor
23 capacitor
24 step-down switching regulator first power supply unit
25 electronic control device
26 capacitor
27 third power supply unit
28 resistor

The invention claimed is:

1. An electronic control device comprising:
a microcomputer;
a power supply control unit that controls a power supply voltage of the microcomputer; and
a capacitor provided between the power supply control unit and the microcomputer,
wherein the power supply control unit includes
a power supply unit that supplies the power supply voltage to the microcomputer by turning ON an activation signal for activating the microcomputer, and stops the supply of the power supply voltage by turning the activation signal OFF,
a reset control unit that generates a Low reset signal by turning the activation signal OFF, and
a discharge control unit that discharges electric charges of the capacitor when acquiring the Low reset signal,
an activation control unit that controls activation of the microcomputer based on the activation signal; and
an output diagnosis unit that diagnoses whether the power supply voltage supplied to the microcomputer is lower than a threshold value set in advance, when the activation signal is switched from OFF to ON,
wherein the activation control unit
prohibits the supply of the power supply voltage by the power supply unit when the output diagnosis unit diagnoses that the power supply voltage is equal to or higher than the threshold value, and
permits the supply of the power supply voltage by the power supply unit when the output diagnosis unit diagnoses that the power supply voltage is lower than the threshold value,
wherein the power supply unit includes
a first power supply unit that supplies a first power supply voltage to the microcomputer, and
a second power supply unit that supplies a second power supply voltage to the microcomputer,
wherein the capacitor includes
a first capacitor provided between the first power supply unit and the microcomputer, and
a second capacitor provided between the second power supply unit and the microcomputer, and
the discharge control unit discharges electric charges of the first capacitor and electric charges of the second capacitor when acquiring the Low reset signal from the reset control unit, and wherein the output diagnosis unit diagnoses whether the first power supply voltage is lower than a first threshold value set in advance, and the second power supply voltage is lower than a second threshold value set in advance, when the activation signal is switched from OFF to ON, and the activation control unit prohibits a supply of the first power supply voltage by the first power supply unit and a supply of the second power supply voltage by the second power supply unit, when the output diagnosis unit diagnoses that at least one of a situation in which the first power supply voltage is equal to or higher than the first threshold value and a situation in which the second power supply voltage is equal to or higher than the second threshold value has occurred, and permits the supply of the first power supply voltage by the first power supply unit and the supply of the second power supply voltage by the second power supply unit, when the output diagnosis unit diagnoses that the first power supply voltage is lower than the first threshold value set in advance, and the second power supply voltage is lower than the second threshold value set in advance.

2. The electronic control device according to claim 1, wherein the power supply unit is a switching regulator including a switch that causes the power supply voltage to be turned ON or OFF, and is configured so that a load current on an output side of the switching regulator increases by a discharge operation of the discharge control unit.

3. The electronic control device according to claim 1, wherein the second power supply unit generates a second power supply voltage by using the first power supply voltage of the first power supply unit.

4. The electronic control device according to claim 1, wherein the discharge control unit uses a battery voltage as a drive power supply.

5. The electronic control device according to claim 1, further comprising a register unit that outputs a control signal for discharge control to discharge electric charges of the capacitor based on a discharge command from the microcomputer, wherein the discharge control unit performs control to discharge the electric charges of the capacitor when acquiring the Low reset signal from the reset control unit or acquiring the control signal for the discharge control from the register unit.

* * * * *